(12) United States Patent
Hoshi et al.

(10) Patent No.: US 10,400,353 B2
(45) Date of Patent: Sep. 3, 2019

(54) METHOD FOR CONTROLLING RESISTIVITY AND N-TYPE SILICON SINGLE CRYSTAL

(71) Applicant: SHIN-ETSU HANDOTAI CO., LTD., Tokyo (JP)

(72) Inventors: Ryoji Hoshi, Nishigo-mura (JP); Hiroyuki Kamada, Nishigo-mura (JP); Kiyotaka Takano, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 88 days.

(21) Appl. No.: 15/503,949

(22) PCT Filed: Aug. 14, 2015

(86) PCT No.: PCT/JP2015/004048
§ 371 (c)(1),
(2) Date: Feb. 14, 2017

(87) PCT Pub. No.: WO2016/031164
PCT Pub. Date: Mar. 3, 2016

(65) Prior Publication Data
US 2017/0260645 A1    Sep. 14, 2017

(30) Foreign Application Priority Data
Aug. 29, 2014 (JP) .................. 2014-175999

(51) Int. Cl.
*C30B 29/06* (2006.01)
*C30B 15/04* (2006.01)
(Continued)

(52) U.S. Cl.
CPC .............. *C30B 15/04* (2013.01); *C30B 15/20* (2013.01); *C30B 29/06* (2013.01); *H01L 29/167* (2013.01); *H01L 29/7393* (2013.01)

(58) Field of Classification Search
CPC ................................. C30B 15/04; C30B 29/06
(Continued)

(56) References Cited

U.S. PATENT DOCUMENTS

| 2011/0156216 A1* | 6/2011 | Nakai ............... C30B 15/04 |
| | | 257/617 |
| 2013/0037920 A1* | 2/2013 | Shiga ............... C30B 15/00 |
| | | 257/628 |
| 2013/0277809 A1 | 10/2013 | Nakai et al. |

FOREIGN PATENT DOCUMENTS

| CN | 1696355 A | 11/2005 |
| CN | 101654804 A | 2/2010 |

(Continued)

OTHER PUBLICATIONS

May 30, 2017 Office Action issued in Japanese Patent Application No. 2014-175999.
(Continued)

Primary Examiner — Khanh T Nguyen
(74) Attorney, Agent, or Firm — Oliff PLC (57) ABSTRACT

A method controls a resistivity of a grown silicon single crystal by using a dopant when the silicon single crystal is grown by CZ method, including the steps of initially doping with a primary dopant such that the silicon single crystal has a predetermined conductive type and additionally doping with a secondary dopant having a conductive type opposite to that of the primary dopant continuously or intermittently, according to a solidification rate expressed by (crystalized weight)/(initial weight of silicon raw material) while growing the silicon single crystal, wherein in the additional doping step, the additional doping with the secondary dopant is carried out when the solidification rate is a predetermined value α or more, while the crystal is not doped with the secondary dopant until the solidification rate reaches the predetermined value α.

6 Claims, 4 Drawing Sheets

(51) Int. Cl.
*C30B 15/20* (2006.01)
*H01L 29/167* (2006.01)
*H01L 29/739* (2006.01)

(58) Field of Classification Search
USPC .............. 117/13, 19, 20, 200, 202; 257/617; 428/641
See application file for complete search history.

(56) References Cited

FOREIGN PATENT DOCUMENTS

| | | |
|---|---|---|
| CN | 102560645 A | 7/2012 |
| JP | S62-226897 A | 10/1987 |
| JP | H03-247585 A | 11/1991 |
| JP | H06-234592 A | 8/1994 |
| JP | H07-309693 A | 11/1995 |
| JP | H09-221382 A | 8/1997 |
| JP | H10-29894 A | 2/1998 |
| JP | 2002-128591 A | 5/2002 |
| JP | 2004-307305 A | 11/2004 |
| JP | 2012-148949 A | 8/2012 |
| JP | 2013-087008 * 5/2013 ............. C30B 29/06 |

OTHER PUBLICATIONS

Oct. 27, 2015 International Search Report issued in International Patent Application No. PCT/JP2015/004048.

Feb. 14, 2017 Office Action issued in Japanese Patent Application No. 2014-175999.

Feb. 28, 2017 International Preliminary Report on Patentability issued in International Patent Application No. PCT/JP2015/004048.

Aug. 17, 2018 Office Action issued in Chinese Patent Application No. 201580046406.6.

* cited by examiner

METHOD FOR CONTROLLING RESISTIVITY AND N-TYPE SILICON SINGLE CRYSTAL

TECHNICAL FIELD

The present invention relates to a method for controlling a resistivity of a silicon single crystal grown by the CZ method and an n-type silicon single crystal having a resistivity controlled by the method for controlling a resistivity.

BACKGROUND ART

An n-type crystal is mainly used in switching devices for power application such as IGBT (insulated gate bipolar transistor) or the like. Conventionally, EPW (an epitaxial wafer) and FZ-PW (a wafer produced by the FZ method), whose resistivity can be relatively easily controlled, have been used. Unfortunately, EPW is expensive since an additional step (an epitaxial growth step) is included compared with CZ-PW (a wafer produced by the CZ method), and the FZ method has a difficulty in increasing a crystal diameter. Therefore, use of CZ-PW on which no epitaxial layer is stacked has attracted attention. However, a silicon single crystal produced by the CZ method causes a segregation phenomenon, so that it is difficult to uniform its resistivity distribution in an axial direction (a pulling axial direction).

To solve this problem, Patent Documents 1 and 2 disclose methods in which a primary dopant and a secondary dopant having an opposite polarity and a small segregation coefficient relative to the primary dopant are added (i.e., counter doping). Such methods can improve the axial resistivity distribution of CZ single crystals. It should be noted that a dopant mostly used for producing n-type crystals is phosphorus (P), whose segregation coefficient is about 0.35. Meanwhile, an element having an opposite polarity and a smaller segregation coefficient than that of phosphorus (P) is, for example, Ga, In, and Al. These elements are heavy metals, and it is reported that when such elements are contained in, for example, an oxide film, the oxide film is degraded in electrical characteristics. Effects of these elements on device characteristics are not well known. Therefore, B (boron), which is a mainly used p-type dopant and widely used for producing devices, is preferably used as an element having the opposite polarity, if possible. However, boron (B) has a segregation coefficient of about 0.78, which is larger than the segregation coefficient of phosphorus (P), and thus cannot be used in the above techniques.

As means for solving this point, Patent Document 3 discloses a method in which boron (B) is continuously added relative to phosphorus (P) of the primary dopant. This method enables production of an n-type crystal having an improved axial resistivity distribution by counter doping using phosphorus (P) as the primary dopant and boron (B) as the secondary dopant.

CITATION LIST

Patent Literature

Patent Document 1: Japanese Unexamined Patent publication (Kokai) No. 2002-128591
Patent Document 2: Japanese Unexamined Patent publication (Kokai) No. 2004-307305
Patent Document 3: Japanese Unexamined Patent publication (Kokai) No. H03-247585
Patent Document 4: Japanese Unexamined Patent publication (Kokai) No. H10-029894
Patent Document 5: Japanese Unexamined Patent publication (Kokai) No. H06-234592

SUMMARY OF INVENTION

Technical Problem

However, the method disclosed in Patent Document 3 has a problem of an inability to re-melt a single crystal in which dislocation occurs. In single crystal production by the usual CZ method (including the MCZ method), single crystallization is often disturbed due to some cause, which leads to dislocation. Once dislocation occurs, the dislocation generated at a dislocation portion slips into another portion that has been already crystallized but is still hot; this phenomenon is called slip back. This yields a single crystal only having a length obtained by subtracting a slip back length from a length at which the dislocation is generated. Furthermore, since a crystal top portion includes an irregular portion where qualities other than resistivity, such as oxygen concentration and grown-in defect characteristics, do not meet standards, a portion some length away from the top is generally used to yield products. Thus, when dislocation occurs in a crystal having a relatively short length, products cannot be obtained at all due to the slip back and the top portion, which is not suited for products. Accordingly, the crystal in which dislocation occurs is put into a raw material melt (a silicon melt) and re-melted to start the single crystal production again. In case of the method of Patent Document 3, the dopant having an opposite polarity is already contained in the crystal and the raw material melt at the point in time when the dislocation is generated. If such a crystal is re-melted, products cannot be obtained due to lack of the primary dopant. Thus, a crystal part including the dislocation portion requires detaching from the raw material melt and discarding, which causes a problem of significantly reducing a yield.

Besides, Patent Document 4 discloses a method in which the dopant having an opposite polarity is stored in the bottom of a crucible, and the dopant is eluted before the resistivity decreases. In this method, however, the control is not based on the solidification rate nor the crystal length, but the control is based on the melting amount of the crucible. Since melting of the crucible proceeds also during re-melting, the dopant to be added is eluted earlier than an intended position by re-melting, which leads to an increase in resistivity. Thus, re-melting cannot be used also in this method.

The present invention was accomplished in view of the above-described problems. It is an object of the present invention to provide a resistivity controlling method that can inhibit the reduction in yield even if dislocation occurs during silicon single crystal growth by the CZ method and can control the resistivity of a silicon single crystal with high precision.

Solution to Problem

To achieve this object, the present invention provides a method for controlling a resistivity of a grown silicon single crystal by using a dopant when the silicon single crystal is grown by CZ method, the method comprising the steps of: initially doping with a primary dopant such that the silicon single crystal has a predetermined conductive type; and additionally doping with a secondary dopant having a conductive type opposite to that of the primary dopant continuously or intermittently, according to a solidification rate expressed by (crystalized weight)/(initial weight of silicon raw material) while growing the silicon single crystal, wherein in the additional doping step, the additional doping with the secondary dopant is carried out when the solidification rate is a predetermined value α or more, while the crystal is not doped with the secondary dopant until the solidification rate reaches the predetermined value α.

Such a method, in which the additional doping with the secondary dopant is carried out when the solidification rate is a predetermined value α or more, while the crystal is not doped with the secondary dopant until the solidification rate reaches the predetermined value α, allows re-melting until the solidification rate reaches the predetermined value α in silicon single crystal growth even if dislocation occurs. Moreover, if dislocation occurs after the solidification rate reaches the predetermined value α, the silicon single crystal has already been grown to some extent. This yields a single crystal having a length obtained by subtracting a slip back length from a length from the single crystal top to the position at which dislocation is generated, thus enabling to inhibit the reduction in yield. In addition, since the additional doping with the secondary dopant is performed according to the solidification rate, the resistivity of the silicon single crystal can be controlled with high precision.

A segregation coefficient of the secondary dopant is preferably larger than a segregation coefficient of the primary dopant.

The present invention can be favorably applied when the segregation coefficient satisfies the above relationship.

The method preferably further comprises the step of repeatedly growing a second or later silicon single crystal with an additional charge of a raw material after growing a first silicon single crystal, wherein the step of repeatedly growing a second or later silicon single crystal includes the stages of: adding the primary dopant in consideration of an amount of the secondary dopant that has been added in previous growth of the silicon single crystal; and additionally doping with the secondary dopant continuously or intermittently according to the solidification rate after the solidification rate reaches the predetermined value α or more such that the crystal is not doped with the secondary dopant until the solidification rate reaches the predetermined value α, while growing the silicon single crystal.

In this manner, the present invention can be applied even in a multi-pulling method for growing a plurality of silicon single crystals with one crucible.

The predetermined value α is preferably a first solidification rate or more and a second solidification rate or less, where the first solidification rate is a rate at which a product can be obtained even if dislocation occurs and slip back is caused in the crystal having a straight body length corresponding to the first solidification rate, and a second solidification rate is a rate at which a resistivity of the silicon single crystal satisfies a predetermined standard only by a dopant added before growing the silicon single crystal.

When the predetermined value α is in the above range, the reduction in yield can be surely inhibited.

The predetermined value α preferably satisfies $k/4 \leq \alpha \leq 2k$ (provided that when $2k>1$, $k/4 \leq \alpha \leq 1$) where k is a segregation coefficient of the primary dopant.

When the predetermined value α is in the above range, the reduction in yield can be surely inhibited.

The additional doping with the secondary dopant is preferably performed by inserting or introducing a silicon thin rod containing the secondary dopant or a doping agent obtained by pulverizing a silicon crystal containing the secondary dopant into a silicon melt in a region between the grown silicon crystal and a crucible wall.

Such procedures can be suitably used for the additional doping with the secondary dopant.

Furthermore, the present invention provides an n-type silicon single crystal having a resistivity controlled by the above-described method for controlling a resistivity, wherein the primary dopant is P (phosphorus), the secondary dopant is B (boron), a difference $N_P-N_B$ ranges from $1.4 \times 10^{12}$ atoms/cm$^3$ to $1.4 \times 10^{15}$ atoms/cm$^3$, where $N_P$ is a phosphorus concentration in the silicon crystal and $N_B$ is a boron concentration in the silicon crystal, and the resistivity ranges from 3 Ω·cm to 3000 Ω·cm.

This n-type silicon single crystal has high qualities and can be produced at a high yield.

Advantageous Effects of Invention

As mentioned above, the present invention can inhibit the reduction in yield even if dislocation occurs during silicon single crystal growth and can control the resistivity of a silicon single crystal with high precision.

DESCRIPTION OF EMBODIMENTS

Hereinafter, embodiments of the present invention will be described with reference to the drawings, but the present invention is not limited thereto.

As mentioned above, although use of CZ-PW on which no epitaxial layer is stacked has attracted attention, a silicon single crystal produced by the CZ method causes a segregation phenomenon, and it is difficult to uniform its resistivity distribution in an axial direction (a pulling axial direction). On the other hand, Patent Document 3 discloses a method in which B is continuously added relative to the primary dopant P. This method enables production of an n-type crystal having an improved axial resistivity distribution by counter doping using P as the primary dopant and B as the secondary dopant. However, the method disclosed in Patent Document 3 has a problem of an inability to re-melt a single crystal in which dislocation occurs. More specifically, in case of the method of Patent Document 3, the secondary dopant having an opposite polarity is already contained in the crystal and the raw material melt at the point in time when the dislocation is generated. If such a crystal is re-melted, products cannot be obtained due to lack of the primary dopant. Thus, a crystal part including the dislocation portion requires detaching from the raw material melt, taking out, and discarding, which causes a problem of significantly reducing a yield.

In view of this, the present inventors diligently conducted studies on a resistivity controlling method that can inhibit the reduction in yield even if dislocation occurs during silicon single crystal growth and can control the resistivity of a silicon single crystal with high precision. As a result, the present inventors found that the method in which additional doped with the secondary dopant is carried out when the solidification rate is a predetermined value α or more while the crystal is not doped with the secondary dopant until the solidification rate reaches the predetermined value α allows re-melting until the solidification rate reaches the predetermined value α in silicon single crystal growth even if dislocation occurs. Moreover, if dislocation occurs after the solidification rate reaches the predetermined value α, the silicon single crystal has already been grown to some extent. Thus, a resulting single crystal can have a length obtained by subtracting a slip back length from a length from the single crystal top to the position at which dislocation is generated, and the reduction in yield can be inhibited. From the above findings, the present invention was brought to completion.

The segregation phenomenon and the solidification rate will be simply described below. During the solidification (crystallization) of silicon, impurities in a melt are difficult to be taken in the crystal. At this time, a ratio of a concentration of impurities taken in the crystal to a concentration of impurities present in the melt, that is, (concentration of impurities taken in crystal)/(concentration of impurities in melt) is referred to as segregation coefficient k. Accordingly, the crystal impurity concentration $C_S$ at a certain moment and the melt impurity concentration $C_L$ at the same moment have a relationship of $C_S=k \times C_L$. k is generally a number less than 1, and thus the concentration of impurities taken in the crystal is lower than the concentration of impurities in the melt. Since the crystal is continuously grown, many impurities remain in the melt, and the concentration of impurities in the melt gradually increases. Along with this, the concentration of impurities in the crystal also increases. This concentration $C_s$ is expressed by $C_S(x)=C_{L0} \times k \times (1-x)^{(k-1)}$, where x is a solidification rate represented by a ratio of crystallized weight to initial raw material weight, and $C_{L0}$ is an initial concentration of impurities in the melt. Accordingly, as the crystal length and the solidification rate x increase, the concentration of impurities in the crystal increases, and the resistivity decreases. To prevent the resistivity from decreasing below a standard, it is necessary to add the secondary dopant continuously or intermittently while appropriately adjusting the doping amount of the secondary dopant with respect to the solidification rate. However, introduction of the secondary dopant makes re-melting impossible when dislocation occurs. Thus, the secondary dopant is required not to be introduced until the solidification reaches the predetermined value α.

Such a method in which the secondary dopant is continuously or intermittently added during silicon single crystal growth is suited for the case where the segregation coefficient of the secondary dopant is larger than the segregation coefficient of the primary dopant. Of course, the present invention can also be applied to the case where the segregation coefficient of the secondary dopant having an opposite polarity to the primary dopant is smaller than the segregation coefficient of the primary dopant. However, additional doping with the secondary dopant during single crystal growth has a risk of causing dislocation. Patent Documents 1 and 2 disclose that when the segregation coefficient of the secondary dopant is smaller than the segregation coefficient of the primary dopant, an axial uniformity can be increased only by initially introducing the secondary dopant. Thus, the present invention is more suited for the case where the segregation coefficient of the secondary dopant is larger than the segregation coefficient of the primary dopant, which is more difficult to control the resistivity. In addition, the present invention is suited for the case where the segregation coefficient of the secondary dopant is larger than that of the primary dopant in consideration of the point that boron (B), which is not heavy metal and has a larger segregation coefficient than that of phosphorus (P), is usable as the secondary dopant when phosphorus (P) is used as the primary dopant.

Hereinafter, an exemplary CZ single crystal growth apparatus used for carrying out the resistivity controlling method of the present invention will be described with reference to FIG. 2.

Figure 2:
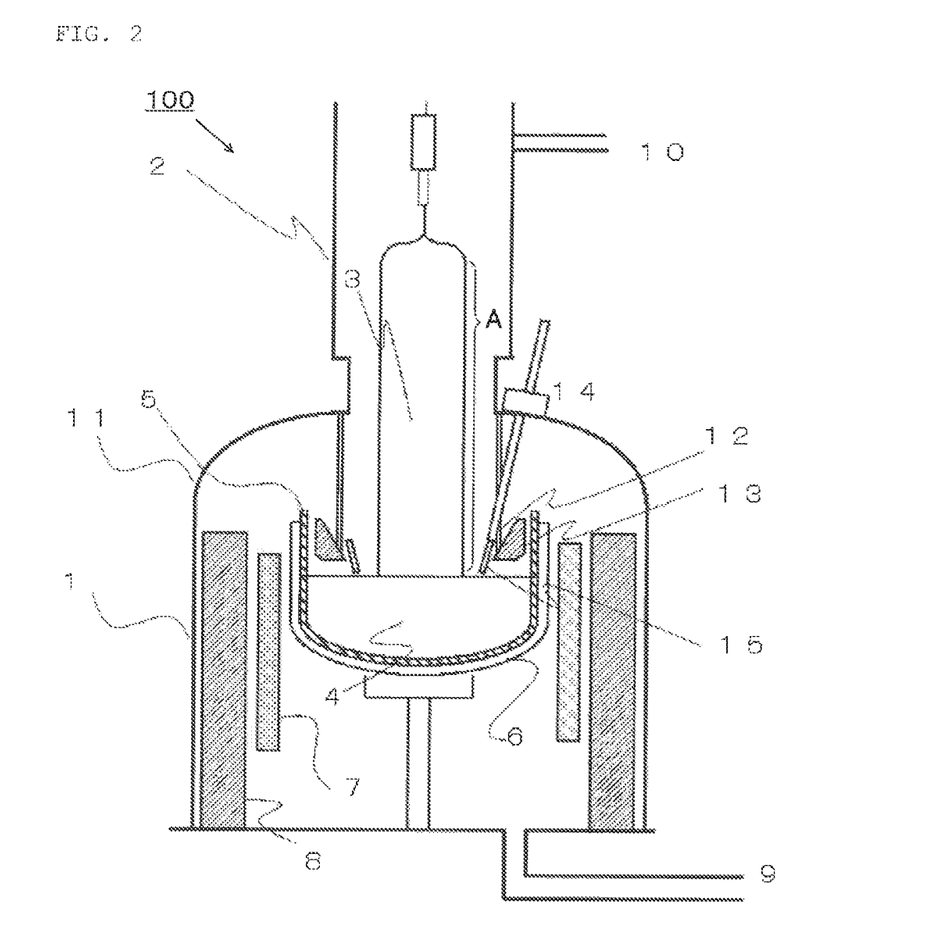
FIG. 2 is a diagram showing an exemplary single crystal growth apparatus used for carrying out the resistivity controlling method of the present invention.

As shown in FIG. 2, a CZ single crystal growth apparatus 100 includes a member for storing and melting a polycrystalline silicon raw material and a heat insulation member for interrupting heat which are accommodated in a main chamber 1. A pulling chamber 2 is continuously provided above a ceiling (a top chamber 11) of the main chamber 1, and a mechanism (not shown) for pulling a single crystal rod (a silicon single crystal) 3 with a wire is provided thereabove.

Within the main chamber 1, a quartz crucible 5 for storing a melted raw material melt (a silicon melt) 4 and a graphite crucible 6 for holding the quartz crucible 5 are provided. These crucibles 5, 6 are held with a drive mechanism (not shown) so as to be rotatable and upwardly and downwardly movable along a crucible axis. A heater 7 for melting the raw material is disposed so as to surround the crucibles 5, 6. The heater 7 is surrounded with a heat insulating material 8 outwardly disposed.

At the upper position of the pulling chamber 2, a gas inlet 10 is provided. An inert gas such as argon gas is introduced through the inlet and then discharged through a gas outlet 9 provided at a lower portion of the main chamber 1. Moreover, a heat shielding member 13 is provided opposite to the raw material melt 4 so as to cut radiation from the surface of the raw material melt 4 and maintain the temperature of the surface of the raw material melt 4.

Furthermore, a gas purge cylinder 12 is provided above the raw material melt 4 and configured to purge a periphery of the single crystal rod 3 with an inert gas introduced through the gas inlet 10.

The top chamber 11 is provided with a thin rod insertion unit 14 that is configured to insert a thin rod crystal (a silicon thin rod) 15 containing the secondary dopant into the raw material melt 4 when additional doping with the secondary dopant is performed.

Next, the method for controlling a resistivity according to the present invention will be described with reference to FIGS. 1 and 2. Firstly, a silicon single crystal is initially doped with a primary dopant such that the silicon single crystal has a predetermined conductive type (See S11 in FIG. 1).

More specifically, before beginning the growth of the silicon single crystal 3, the primary dopant is introduced in the raw material melt 4 such that the silicon single crystal 3 has a predetermined conductive type. The primary dopant may be, for example, phosphorus (P) when an n-type silicon single crystal is grown.

Figure 1:
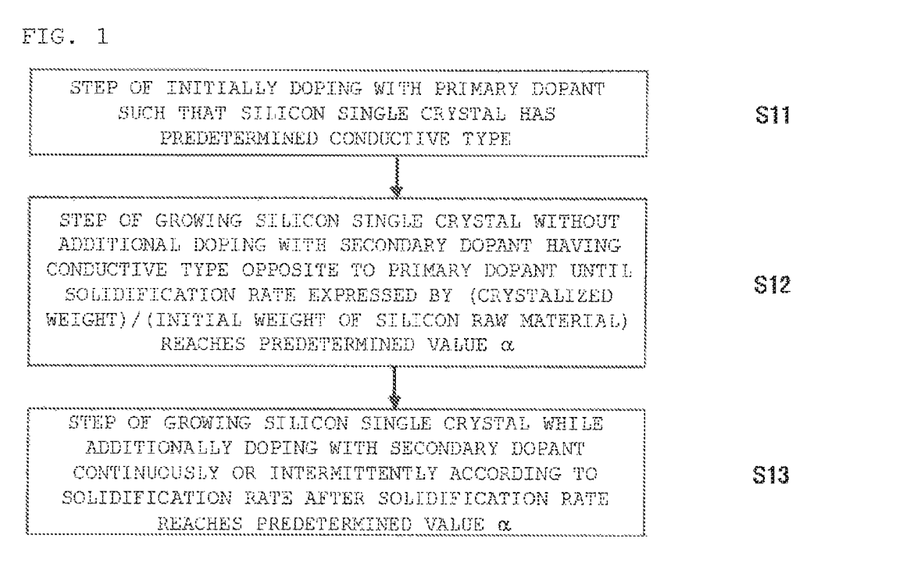
FIG. 1 is a flow chart showing a resistivity controlling method according to an embodiment of the present invention.

Then, the silicon single crystal is grown without additional doping with a secondary dopant having a conductive type opposite to that of the primary dopant, until a solidification rate expressed by (crystalized weight)/(initial weight of silicon raw material) reaches a predetermined value α (See S12 in FIG. 1).

More specifically, until the solidification rate reaches the predetermined value α, that is, until the length of a straight body portion A of the silicon single crystal 3 becomes $L_\alpha$, the silicon single crystal 3 is grown without adding the secondary dopant. Herein, $L_\alpha$ represents a length of the straight body portion of the silicon single crystal 3 when the solidification rate is the predetermined value α. Since the secondary dopant is not added until the length of the straight body portion A of the silicon single crystal 3 becomes $L_\alpha$, the silicon single crystal 3 can be re-melted to start the growth again even if dislocation has occurred.

The growth of the silicon single crystal 3 is performed by the CZ method. The CZ method includes a so-called MCZ method, in which a magnetic field is applied.

Then, after the solidification rate reaches the predetermined value α, the silicon single crystal is grown while additionally doping with the secondary dopant continuously or intermittently, according to the solidification rate (See S13 in FIG. 1).

More specifically, after the solidification rate reaches the predetermined value α, that is, after the length of the straight body portion A of the silicon single crystal 3 becomes $L_\alpha$, the silicon single crystal 3 is grown while adding the secondary dopant continuously or intermittently, according to the solidification rate (i.e., the length of the straight body portion). The secondary dopant may be, for example, boron (B) when phosphorus (P) is used as the primary dopant. After the length of the straight body portion A of the silicon single crystal 3 becomes $L_\alpha$, even if dislocation occurs, the silicon single crystal has already been grown to some extent. Thus, the growth of the silicon single crystal 3 is terminated at this point, and the single crystal having a length obtained by subtracting a slip back length from a length from the top of the silicon single crystal 3 to the position at which dislocation is generated, can be obtained.

In this case, the segregation coefficient of the secondary dopant is preferably larger than the segregation coefficient of the primary dopant.

The present invention can be favorably applied when the segregation coefficient satisfies the above relationship.

The inventive method preferably further includes the step of repeatedly growing a second or later silicon single crystal with an additional charge of a raw material into a crucible after growing a first silicon single crystal, wherein the step of repeatedly growing a second or later silicon single crystal includes the stages of: adding the primary dopant in consideration of an amount of the secondary dopant that has been added in previous growth of the silicon single crystal; and additionally doping with the secondary dopant continuously or intermittently according to the solidification rate after the solidification rate reaches the predetermined value α or more such that the crystal is not doped with the secondary dopant until the solidification rate reaches the predetermined value α, while growing the silicon single crystal.

When the present invention is applied to the multi-pulling method for growing a plurality of silicon single crystals with one crucible by additionally feeding the raw material, the raw material melt 4 contains the secondary dopant before beginning the growth of the second or later silicon single crystal. This causes the dopant having a conductive type opposite to the primary dopant to be contained in single crystals to be grown from the single crystal top. Thus, the primary dopant needs to be added to offset a concentration of the secondary dopant to be contained in the single crystal top, that is, a concentration obtained by multiplying the concentration of the secondary dopant in the raw material melt 4 by the segregation coefficient of the secondary dopant, as well as the amount of the primary dopant is adjusted to achieve an intended resistivity.

Thus, also when a single crystal is pulled from a raw material melt in which the concentration of the primary dopant is adjusted, the secondary dopant is preferably not added unless the solidification rate exceeds the predetermined value α. Since the primary dopant is introduced in an amount to offset the secondary dopant that has been added in previous silicon crystal growth, re-melting is practicable unless a new secondary dopant is added (i.e., until the solidification rate reaches the predetermined value α) even if dislocation occurs. After the solidification rate becomes the predetermined value α or more, additional doping is preferably performed continuously or intermittently in an appropriate amount determined based on the amounts of the primary and secondary dopants that have been introduced, according to the solidification rate. In this manner, the resistivity can be precisely controlled even in the multi-pulling method in which the secondary dopant has been added through the previous single crystal growth.

The predetermined value α is preferably a first solidification rate or more and a second solidification rate or less, where the first solidification rate is a rate at which a product can be obtained even if dislocation occurs and slip back is caused in the crystal having a straight body length corresponding to the first solidification rate, and the second solidification rate is a rate at which a resistivity of the silicon single crystal satisfies a predetermined standard only by a dopant added before growing the silicon single crystal.

When the predetermined value α is in the above range, the crystal in which dislocation is generated can be re-melted unless additional doping with the secondary dopant is carried out. In addition, even if dislocation occurs after additional doping with the secondary dopant is carried out, the crystal already has a sufficient length to obtain products. Thus, the crystal can be taken out to obtain products. Furthermore, the raw material may be additionally fed at this state to proceed to a subsequent silicon single crystal growth.

Moreover, as previously described, dislocation is often generated at the moment of additional doping with the secondary dopant. If the additional doping is just started and only a minute amount of the secondary dopant is introduced, re-melting is practicable. For example, even considering a resistivity increased by the secondary dopant that has been added so far, re-melting does not reduce a yield due to the resistivity so long as the resistivity is within the standard at an initial uppermost position of the silicon single crystal from which products can be obtained. Thus, re-melting is practicable.

Furthermore, if the resistivity of the uppermost position, from which products can be obtained, does not satisfy the standard, but a region satisfying the standard is not significantly shifted, and the reduction in yield is judged to be small, re-melting is practicable even after additional doping with the secondary dopant.

Not only after additional doping with the secondary dopant, but also before additional doping with the secondary dopant, it can be determined whether the crystal in which dislocation occurs is taken out or re-melted on the basis of total judgment on yield and productivity. The reason is that re-melting does not reduce a yield but takes time, resulting in a reduction of productivity. Although re-melting is not an option in case that additional doping is initially performed, the present invention enables judgment whether the crystal is taken out or re-melted as well as total judgement on yield and productivity. Therefore, when the predetermined value α of the solidification rate is in the above range, the reduction in yield can be more effectively inhibited.

The predetermined value α may satisfy $k/4 \leq \alpha \leq 2k$ (provided that when $2k>1$, $k/4 \leq \alpha \leq 1$) where k is the segregation coefficient of the primary dopant. As described above, the predetermined value α is preferably the first solidification rate, at which a product can be obtained even if dislocation occurs and slip back is caused at a corresponding crystal length, or more and the second solidification rate, at which the resistivity satisfies a standard only by a dopant introduced before pulling the crystal, or less. The silicon single crystal length corresponding to the solidification rate at which the resistivity satisfies the standard only by a dopant introduced before pulling the crystal is long when the segregation coefficient of the primary dopant is large, and is short when the segregation coefficient is small. Thus, the predetermined value α of the solidification rate is almost proportional to the segregation coefficient k of the primary dopant.

However, this relation cannot be specifically expressed. The reason is that the relation depends on a product design of the crystal. For example, a straight body length of a top side position that reaches standards of crystal qualities, such as oxygen concentration and crystal defect, varies from 10 cm to 30 cm. This is because the length depends on the strictness of the standards of qualities other than the resistivity. Since the resistivity is adjusted so as to satisfy its standard within the length used for products, the "solidification rate at which the resistivity satisfies a standard only by a dopant introduced before pulling the crystal" finally depends on a product design of the crystal, and thus cannot be determined uniquely. Considering such a vertical shift due to the product design to set an approximate value, the predetermined value α of the solidification rate ranges $k/4 \leq \alpha \leq 2k$. When the predetermined value α of the solidification rate is k/4 or more, a product can be obtained even if dislocation occurs and slip back is caused at a silicon single crystal length corresponding to the solidification rate. When the predetermined value α of the solidification rate is 2k or less, the resistivity can satisfy a standard only by a dopant introduced before growing the silicon single crystal.

As examples of a method of additional doping with the secondary dopant of an appropriate amount according to the solidification rate, there may be mentioned a method in which a silicon thin rod containing the secondary dopant is inserted into the raw material melt 4 between the crucible wall and the silicon single crystal 3 during growth, or a method in which a doping agent obtained by pulverizing a silicon crystal containing the secondary dopant is introduced into the raw material melt 4 between the crucible wall and the silicon single crystal 3 during growth.

Such methods enable additional doping in an appropriate amount according to the solidification rate. For example, when a silicon thin rod 15 is inserted into the raw material melt 4 between the crucible wall and the silicon single crystal 3 during growth, a movable unit (a thin rod insertion unit 14 in FIG. 2) that is attached to the top chamber 11, sealed so as to maintain pressure inside the furnace, and can move the crystal thin rod almost vertically, may be used. In regard to this, techniques disclosed in Patent Document 5 or the like can be applied.

Alternatively, when a doping agent obtained by pulverizing a silicon crystal containing the secondary dopant is introduced into the raw material melt 4 between the crucible wall and the silicon single crystal 3 during growth, a tube that is attached to the top chamber 11, sealed so as to maintain pressure inside the furnace, and configured to introduce the pulverized doping agent into the raw material melt 4 between the crucible wall and the silicon single crystal 3 during growth, may be used.

As the mechanism for additional doping with the secondary dopant, the tube configured to introduce the pulverized doping agent into the raw material melt 4 has a simplified structure. However, this tube introduces the granular dopant in the vicinity of the single crystal during growth and is likely to cause the granular dopant to splash or float, which may lead to dislocation. On the other hand, placement of the movable unit (the thin rod insertion unit 14) that can move the crystal thin rod 15 vertically takes more cost than the above introduction tube, but has an advantage of hardly causing dislocation in the silicon single crystal 3 during growth even if the crystal thin rod is inserted in the vicinity of the crystal during growth.

The above-described resistivity controlling method according to the present invention can inhibit the reduction in yield even if dislocation occurs during silicon single crystal growth and can control the resistivity of a silicon single crystal with high precision.

Next, the n-type silicon single crystal of the present invention will be described.

The n-type silicon single crystal of the present invention is produced by the above-described resistivity controlling method. In this crystal, the primary dopant is phosphorus (P), the secondary dopant is boron (B), a difference $N_P-N_B$ between a phosphorus concentration $N_P$ and a boron concentration $N_B$ in the silicon crystal ranges from $1.4 \times 10^{12}$ atoms/cm$^3$ to $1.4 \times 10^{15}$ atoms/cm$^3$, and the resistivity ranges from 3 Ω·cm to 3000 Ω·cm.

Such an n-type silicon single crystal, which contains phosphorus (P) as the primary dopant and boron (B) as the secondary dopant, is not likely to cause unexpected malfunction since both the elements are widely used for device manufacture. In particular, a high breakdown voltage vertical power device, in which current flows in single crystals as well as reverse bias is applied in the single crystals, requires single crystals having a relatively high resistivity and a high resistivity uniformity. For this device is suited an n-type silicon single crystal in which the phosphorus concentration is higher than the boron concentration, the concentration difference is in the above range, and the resistivity is in the above range. Moreover, the resistivity controlling method of the present invention allows a single crystal to be controlled almost uniformly from the top to the bottom in the CZ method so as to have the desired concentration difference and resistivity within the above ranges. Therefore, a silicon single crystal controlled by the resistivity controlling method of the present invention such that the resistivity meets a narrow standard within the above range is suited for the latest devices such as power devices.

EXAMPLE

Hereinafter, the present invention will be specifically described with reference to examples and comparative example, but the present invention is not limited to these examples.

Example 1

An n-type silicon single crystal having a resistivity standard of 55-75 Ω·cm and a diameter of 200 mm was grown with the CZ single crystal growth apparatus 100 shown in FIG. 2. The initial charge amount of silicon raw materials was 200 kg, and about 160 kg of a silicon single crystal was grown. Considering a single crystal top portion inferior in qualities other than resistivity (e.g., oxygen concentration or the like), initial doping was carried out by using phosphorus (P) as the primary dopant such that the resistivity reached the standard when the straight body portion had a length of about 20 cm from the top of the straight body portion and the solidification rate became about 0.09. In regard to the doping amount, 0.82 g of a doping agent prepared by pulverizing a silicon single crystal having a phosphorus concentration of $4 \times 10^{19}$ atoms/cm$^3$ was used. This doping amount allows the crystal to satisfy the resistivity standard up to a straight body portion length of about 100 cm and a solidification rate of about 0.4, unless the secondary dopant is introduced. Then, additional doping with the secondary dopant was started at the point of time when the silicon single crystal was grown until the straight body portion had a length of 85 cm, and the solidification rate became about 0.34, which corresponds to the situation that the length of the straight body portion is less than 100 cm, and products can be obtained even if the dislocation is generated. In other words, the above-described determined value α of the solidification rate was about 0.34, and the crystal was not doped with the secondary dopant until the determined value α.

The additional doping with the secondary dopant was performed by attaching a thin rod crystal 15 to the tip of the thin rod insertion unit 14 in FIG. 2, and inserting the thin rod crystal 15 into the raw material melt 4. The used thin rod crystal (silicon thin rod) 15 was obtained by cutting a grown single crystal doped with boron (B), having a diameter of about 300 mm and a length of about 300 mm, into silicon single crystal blocks with a resistivity of 0.15 Ωcm and then vertically cutting the block into rectangular columns with a size of 2 cm×2 cm×30 cm. The method of producing the thin rod crystal is not limited thereto. For example, when the block is horizontally cut, the resistivity can be controlled with higher precision.

Figure 3:
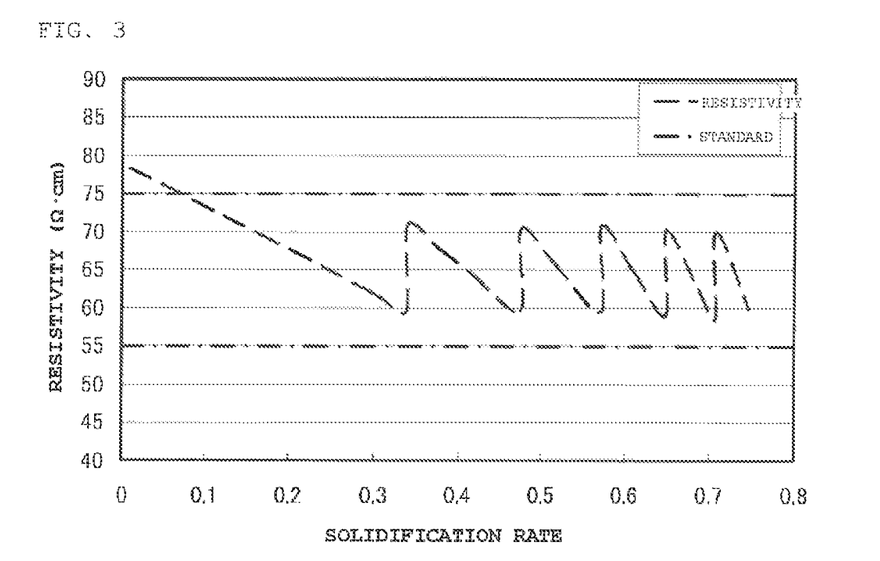
FIG. 3 is a graph showing a relationship between a resistivity and a solidification rate of a silicon single crystal grown in Example 1.

The additional doping of the secondary dopant was performed at solidification rate of 0.34, 0.47, 0.57, 0.65, and 0.71 by intermittently inserting and melting the thin rod crystal (silicon thin rod) in weight of 13, 10, 8.5, 7, and 6 g into the raw material melt 4, respectively. FIG. 3 shows a profile of the resulting resistivity in an axial direction (i.e., a pulling axial direction), that is, a relationship between the resistivity and the solidification rate of the grown silicon single crystal. In this example, the difference $N_P$–$N_B$ between the phosphorus concentration $N_P$ and the boron concentration $N_B$ in the single crystal was 5.5-7.1×10$^{13}$ atoms/cm$^3$. In Example 1, even when dislocation occurred at a straight body length of less than 85 cm (a solidification rate of about 0.34), re-melting and re-production were practicable. Moreover, even when re-melting and re-production were done, the resistivity was within the standard while the solidification rate was from about 0.09 to 0.75. In contrast, when additional doping with the secondary dopant was not carried out, the resistivity was within the standard only while the solidification rate was from about 0.09 to 0.4. Thus, the product length in this example was twice as long as the case where additional doping with the secondary dopant was not carried out.

Example 2

After the crystal of Example 1 was grown, about 160 kg of a silicon raw material was additionally fed so as to give a total raw material weight of 200 kg. For growing the second silicon single crystal, an n-type silicon single crystal having a resistivity standard of 55-75 Ω·cm and a diameter of 200 mm was grown. Calculations showed that the phosphorus (P) concentration remaining in the raw material melt 4 after completion of growth of the first silicon single crystal was 1.7×10$^{14}$ atoms/cm$^3$, and the boron (B) concentration remaining in the raw material melt 4 after completion of growth of the first silicon single crystal was 6.7×10$^{13}$ atoms/cm$^3$. Considering these residues, 0.79 g of a doping agent obtained by pulverizing a silicon crystal having a phosphorus (P) concentration of 4×10$^{19}$ atoms/cm$^3$ was introduced to prepare a raw material melt for growing the second silicon single crystal such that the resistivity reached the standard when the straight body portion had a length of about 20 cm and the solidification rate became about 0.09. Since boron (B) has been already added in the first silicon single crystal growth, the resistivity satisfies the standard within a shorter range than the first crystal, namely, up to a straight body portion length of about 95 cm and a solidification rate of about 0.38 unless additional doping is further carried out. Then, additional doping with the secondary dopant was started at the point of time when the straight body portion had a length of 80 cm, and the solidification rate became about 0.32, which corresponds to the situation that the length of the straight body portion is less than 95 cm, and products can be obtained even if the dislocation is generated. In other words, the above-described predetermined value α of the solidification rate was about 0.32.

Figure 4:
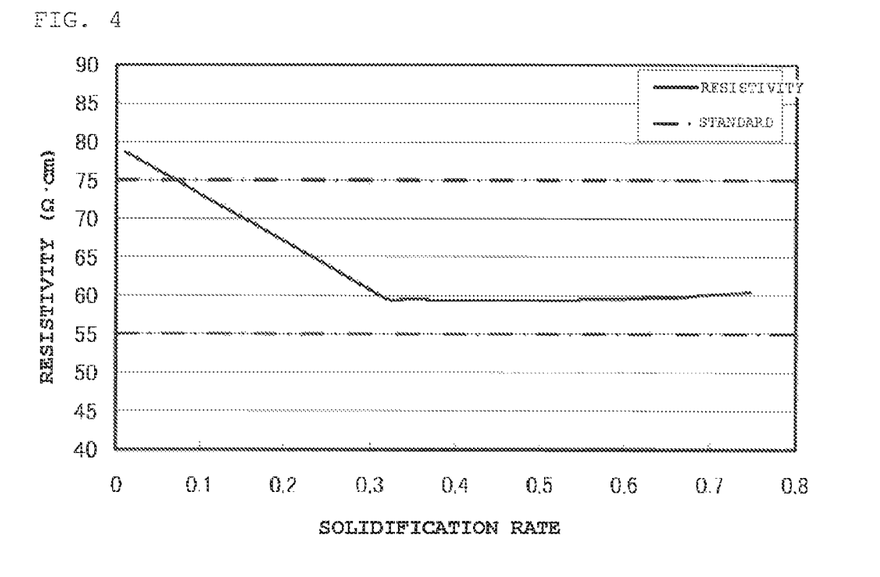
FIG. 4 is a graph showing a relationship between a resistivity and a solidification rate of a silicon single crystal grown in Example 2.

The additional doping was performed by attaching a thin rod crystal (a silicon thin rod) 15 having a resistivity of 0.15 Ω·cm and a size of 2 cm×2 cm×30 cm to the tip of the thin rod insertion unit 14 in FIG. 2, and inserting the thin rod crystal 15 into the raw material melt 4, as in Example 1. However, boron (B) was continuously introduced, unlike Example 1. The amount of the additional doping was determined in proportional to $\{(1-x)^{(kp-1)}-1+[1+kp \times (1-x)^{(kp-1)}]/kb\}$ (where, kp is the segregation coefficient of phosphorus, kb is the segregation coefficient of boron, and x is the solidification rate), based on Patent Document 3. FIG. 4 shows a profile of the resulting resistivity in an axial direction (that is, a relationship between the resistivity and the solidification rate of the grown silicon single crystal). In this example, the difference $N_P$–$N_B$ between the phosphorus concentration $N_P$ and the boron concentration $N_B$ in the single crystal was 5.4-7.1×10$^{13}$ atoms/cm$^3$. As can be seen from FIG. 4, a very uniform resistivity distribution could be obtained in Example 2.

Comparative Example

Figure 5:
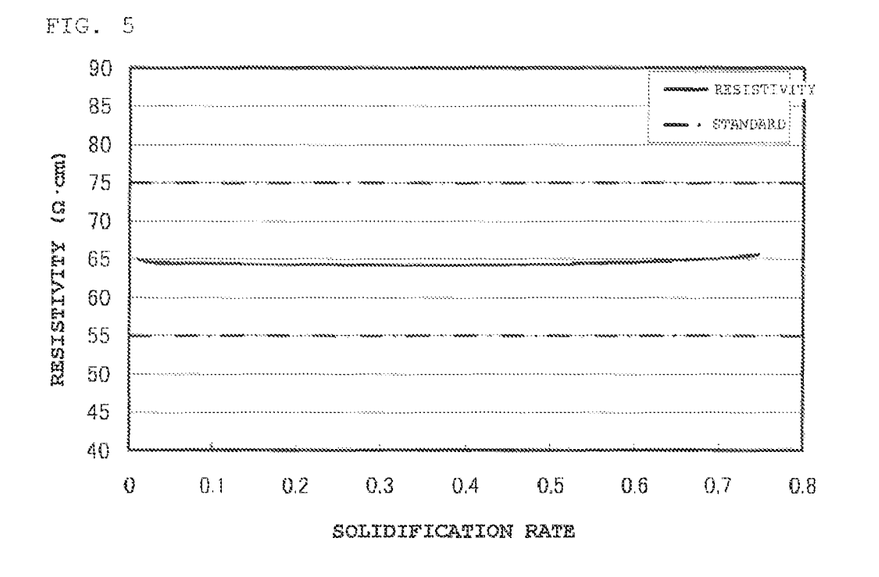
FIG. 5 is a graph showing a relationship between a resistivity and a solidification rate of a silicon single crystal which was planned to be grown in Comparative Example.

A silicon single crystal was grown as in Example 2 except that additional doping with the secondary dopant was started with the beginning of growth of the straight body portion of the silicon single crystal. This setting was planned so as to give an almost flat resistivity from the single crystal top to the single crystal bottom, as shown in FIG. 5. In practice, however, dislocation was generated at a straight body length of 60 cm and a solidification rate of 0.24. Then, re-melting was planned, but calculation showed that if the crystal is grown again after re-melting, the resistivity at the crystal top portion becomes about 80 Ω·cm. Thus, if additional doping with the secondary dopant is started again with the beginning of growth of the straight body portion of the silicon single crystal to pull the single crystal again, a silicon single crystal having a standard resistivity cannot be obtained at all. Therefore, about 48 kg of the silicon single crystal, which corresponds to the straight body with a length of 60 cm, was detached from the raw material melt and taken out from the CZ single crystal production apparatus. The taken silicon single crystal had slip back up to a length of about 30 cm from the top of the straight body portion. 10 cm portion between 20 cm and 30 cm from the top of the straight body portion could have been used for products, but this portion was so short that the cost performance was poor in view of processing loss and so on. Thus, this portion was discarded. As described above, when additional doping was started with the beginning of growth of the straight body portion of the silicon single crystal, no product could be obtained from 48 kg of the raw material, resulting in a significant reduction in yield.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for controlling a resistivity of a grown silicon single crystal by using a dopant when the silicon single crystal is grown by CZ method, the method comprising the steps of:
    initially doping with phosphorus such that the silicon single crystal has n-type conductivity; and
    additionally doping with boron according to a solidification rate expressed by (crystalized weight)/(initial weight of silicon raw material) while growing the silicon single crystal,
    wherein:
    in the additional doping step, the additional doping is carried out when the solidification rate is a predetermined value $\alpha$ or more, while the crystal is not doped with the boron until the solidification rate reaches the predetermined value $\alpha$, and
    the predetermined value $\alpha$ satisfies $k/4 \leq \alpha \leq 2k$, wherein: k is a segregation coefficient of phosphorus, and when $2k>1$, $k/4 \leq \alpha \leq 1$.

2. The method for controlling a resistivity according to claim 1, further comprising a step of repeatedly growing a second or later silicon single crystal with an additional charge of a raw material after growing a first silicon single crystal, wherein the step of repeatedly growing a second or later silicon single crystal includes the stages of:
    adding phosphorus in consideration of an amount of the boron that has been added in previous growth of the silicon single crystal; and
    additionally doping with boron according to the solidification rate after the solidification rate reaches the predetermined value $\alpha$ or more such that the crystal is not doped with the boron until the solidification rate reaches the predetermined value $\alpha$, while growing the silicon single crystal.

3. The method for controlling a resistivity according to claim 2, wherein the predetermined value $\alpha$ is a first solidification rate or more and a second solidification rate or less, where the first solidification rate is a rate at which a product can be obtained even if dislocation occurs and slip back is caused in the crystal having a straight body length corresponding to the first solidification rate, and a second solidification rate is a rate at which a resistivity of the silicon single crystal satisfies a predetermined standard only by a dopant added before growing the silicon single crystal.

4. The method for controlling a resistivity according to claim 2, wherein the additional doping is performed by inserting or introducing a silicon thin rod containing the boron or a doping agent obtained by pulverizing a silicon crystal containing the boron into a silicon melt in a region between the grown silicon crystal and a crucible wall.

5. The method for controlling a resistivity according to claim 1, wherein the predetermined value $\alpha$ is a first solidification rate or more and a second solidification rate or less, where the first solidification rate is a rate at which a product can be obtained even if dislocation occurs and slip back is caused in the crystal having a straight body length corresponding to the first solidification rate, and a second solidification rate is a rate at which a resistivity of the silicon single crystal satisfies a predetermined standard only by a dopant added before growing the silicon single crystal.

6. The method for controlling a resistivity according to claim 1, wherein the additional doping is performed by inserting or introducing a silicon thin rod containing the boron or a doping agent obtained by pulverizing a silicon crystal containing the boron into a silicon melt in a region between the grown silicon crystal and a crucible wall.

* * * * *